(12) United States Patent
Burl et al.

(10) Patent No.: US 6,377,044 B1
(45) Date of Patent: Apr. 23, 2002

(54) MULTI-MODE RECEIVER COILS FOR MRI

(75) Inventors: Michael Burl, Chagrin Falls; John W. Missal, Willoughby; Thomas Chmielewski, Willoughby Hills, all of OH (US)

(73) Assignee: Philips Medical Systems(Cleveland), Inc., Highland Heights, OH (US)

( * ) Notice: Subject to any disclaimer, the term of this patent is extended or adjusted under 35 U.S.C. 154(b) by 0 days.

(21) Appl. No.: 09/516,644

(22) Filed: Mar. 1, 2000

(51) Int. Cl.[7] .............................................. G01V 3/00
(52) U.S. Cl. ..................... 324/307; 324/309; 324/318; 324/322
(58) Field of Search ............... 324/309, 318, 324/319, 322, 307, 311, 314, 306, 300

(56) References Cited

U.S. PATENT DOCUMENTS

| | | | |
|---|---|---|---|
| 4,918,388 A | | 4/1990 | Mehdizadeh et al. ........ 324/322 |
| 5,138,260 A | | 8/1992 | Molyneaux et al. ......... 324/309 |
| 5,374,890 A | * | 12/1994 | Zou et al. .................. 324/318 |
| 5,394,087 A | | 2/1995 | Molyneaux et al. ......... 324/318 |
| 5,510,711 A | | 4/1996 | Molyneaux et al. ......... 324/309 |
| 5,757,189 A | * | 5/1998 | Molyneaux et al. ......... 324/318 |
| 6,097,186 A | * | 8/2000 | Nabetani et al. ............ 324/319 |

* cited by examiner

*Primary Examiner*—Hezron Williams
*Assistant Examiner*—Tiffany A. Fetzner
(74) *Attorney, Agent, or Firm*—Fay, Sharpe, Fagan, Minnich & McKee, LLP

(57) ABSTRACT

A magnetic resonance apparatus includes a multi-mode receiver assembly which facilitates operation in both a quadrature combination mode and phased array mode. The multi-mode receiver assembly includes a receiver coil assembly (30) comprising a first RF coil assembly (32) and a second RF coil assembly (34). A signal combining circuit, which includes a switch means, performs at least one of combining and splitting magnetic resonance signals received by the first and second RF coil assemblies (30, 32). The application of a DC bias potential to the switch means switches the multi-mode receiver assembly into the quadrature combination mode in which the received magnetic resonance signals are phase shifted and combined into a quadrature signal and an anti-quadrature signal. The absence of a DC bias potential to the switch means switches the multi-mode receiver assembly into the phased array mode in which the received magnetic resonance signals are phase shifted and passed individually to corresponding receivers. The multi-mode capability of the receiver assembly allows an operator to switch from a quadrature mode, which is provides faster reconstruction, to a phased array mode, which provides better image quality, within a single examination.

13 Claims, 3 Drawing Sheets

MULTI-MODE RECEIVER COILS FOR MRI

BACKGROUND OF THE INVENTION

The present invention relates to the magnetic resonance arts. It finds particular application in conjunction with medical imaging and will be described with particular reference thereto. It is to be appreciated, however, that the invention may find further application in quality control inspections, spectroscopy, and the like.

Conventionally, magnetic resonance systems generate a strong, temporally constant main magnetic field, commonly denoted $B_0$, in a free space or bore of a magnet. This main magnetic field polarizes the nuclear spin system of an object. Nuclear spins of the object then possess a macroscopic magnetic moment vector preferentially aligned with the direction of the main magnetic field. In a superconducting annular magnet, the $B_0$ magnetic field is generated along the longitudinal axis of the cylindrical bore, which is typically assigned to be the z-axis. In an open system, the $B_0$ magnetic field is typically oriented vertically between a pair of pole pieces, which is again assigned to be the z-axis.

To generate a magnetic resonance signal, the polarized spin system is excited at resonance by applying a radio frequency (RF) magnetic field $B_1$, with a vector component perpendicular to that of the $B_0$ field. In a transmission mode, the radio frequency coil is pulsed to tip the magnetization of the polarized sample away from the z-axis. As the magnetization precesses around the z-axis, the precessing magnetic moment generates a magnetic resonance signal at the Lamor frequency which is received by the same or another radio frequency coil in a reception mode.

Traditionally, RF receiver coils have been utilized with magnetic resonance imaging and spectroscopy equipment in either quadrature mode or phased array mode. Quadrature coils typically include at least two coils or coil arrays which view the same region of interest, but are sensitive to signals 90° out of phase, such as a vertical field and a horizontal field. Analogously, birdcage coils, which are circularly polarized, have taps for two 90° out of phase output signals. Typically, the 90° offset signals from the two coils or coil arrays are connected to an analog phase shifting circuit which causes both signals to have the same phase. Phase shifting and summing the signals typically provides a signal to noise improvement of about the square root of 2. Quadrature mode is preferable where a limited number of channels exists and speed of reconstruction is important.

Alternately, the receiver coils may be operated in a phased array mode in which the 90° offset signals are each forwarded individually to separate receivers. Operation in phased array mode is preferable where improved image quality is important, such as in transverse or coronal scans. Prior art coils either make the quadrature combination on the coil in quadrature mode or output multiple signals to multiple receivers in phased array mode without the ability to switch from one mode to the other.

The present invention contemplates a new and improved radio frequency receiver assembly which overcomes the above-referenced problems and others.

SUMMARY OF THE INVENTION

In accordance with one aspect of the present invention, a magnetic resonance apparatus includes a main magnet which generates a main magnetic field through an examination region. A radio frequency (RF) transmitter coil positioned about the examination region excites magnetic resonance dipoles therein. An RF transmitter drives the RF transmitter coil. A multi-mode RF receiver coil assembly receives magnetic resonance signals from the resonating dipoles and at least two receivers receive and demodulate output signals from the receiver coil assembly. The receiver coil assembly includes at least one first RF coil which is sensitive to a magnetic field along a first axis. The receiver coil assembly further includes at least one second RF coil which is sensitive to magnetic fields along a second axis which is orthogonal to the first axis. A signal combining circuit which is operatively connected to the first and second RF coils has a quadrature combining mode in which it quadrature combines signals received by the first and second RF coils and a phased array mode in which it passes signals received by the first and second RF coils to corresponding receivers without combining the signals. A switch assembly is connected to the signal combining circuit. The switch assembly switches the combining circuit between the quadrature combining mode and the phased array mode.

A multi-mode magnetic resonance method includes generating a main magnetic field through an examination region and transmitting RF signals into the examination region to induce magnetic resonance in nuclei. The induced magnetic resonance signals are received using a first RF coil and a second RF coil. The received magnetic resonance signals are phased shifted. One of a quadrature combination mode and a phased array mode is selected. In the quadrature combination mode, the phased shifted received magnetic resonance signals are combined, while in the phased array mode, the received magnetic resonance signals are passed uncombined. The received magnetic resonance signals are demodulated and reconstructed into an image representation.

In accordance with another aspect of the present invention, a multi-mode RF assembly for use in a magnetic resonance apparatus includes a first RF coil assembly comprising at least one RF coil which is sensitive to a magnetic field along a first axis to generate a first resonance signal. A second RF coil assembly comprising at least one RF coil is sensitive to a magnetic field along a second axis which is orthogonal to the first axis to generate a second resonance signal 90° out of phase from the first resonance signal. A phase shift circuit shifts a relative phase of the first and second resonance signals by 90°. A signal combining circuit combines the phase shifted first and second resonance signals. A switch assembly switches between outputting a combined signal and the first and second resonance signals.

In accordance with another aspect of the present invention, a method of quadrature operation in a magnetic resonance apparatus includes generating a temporally constant magnetic field through an examination region and transmitting RF signals into the examination region to induce magnetic resonance in nuclei. Induced magnetic resonance signals are detected in quadrature using a quadrature coil assembly. The detected quadrature signals are phase-shifted by 90° and combined into a quadrature signal and an anti-quadrature signal using a quadrature adder. The quadrature and anti-quadrature signals are transferred to a pair of receivers and reconstructed into an image representation.

One advantage of the present invention is that it provides switching between quadrature combination mode and phased array mode depending on the type of examination.

Another advantage of the present invention is that it uses the anti-quadrature signal from a quadrature combiner to improve image quality.

Another advantage of the present invention resides in use of quadrature mode for applications which require faster reconstruction speed.

Yet another advantage of the present invention resides in use of phased array mode for applications which require better image quality.

Other benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
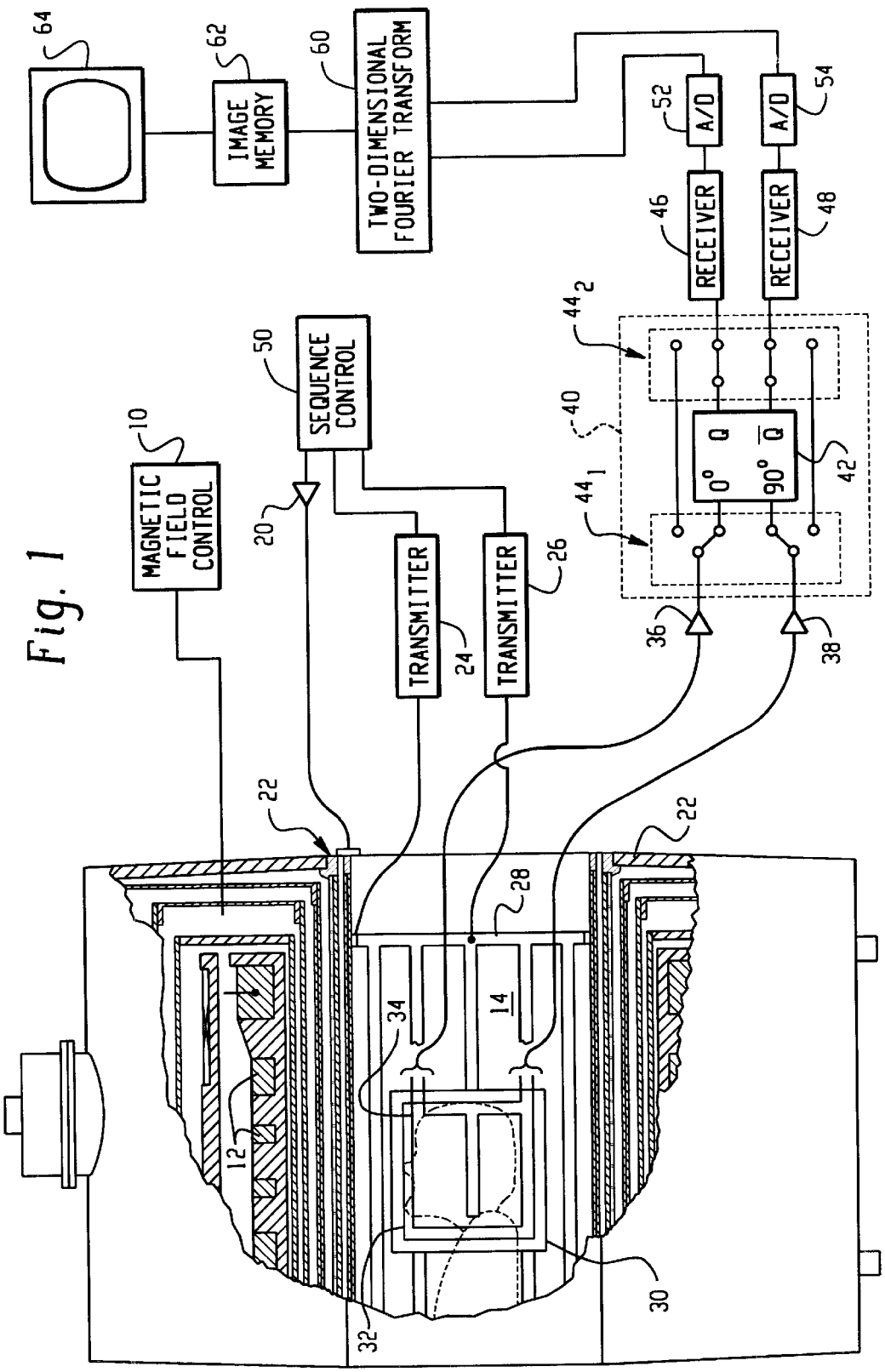
FIG. 1 is a diagrammatic illustration of a magnetic resonance system in accordance with the present invention.

With reference to FIG. 1, a main magnetic field control 10 controls superconducting or resistive magnets 12 such that a substantially uniform, temporally constant main magnetic field $B_0$ is created along a z-axis through an examination region 14. Although a bore-type magnet is illustrated in FIG. 1, it is to be appreciated that the present invention is applicable to open or vertical field magnetic systems as well. A magnetic resonance sequence applies a series of radio frequency (RF) pulses $B_1$ and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. Radio frequency transmitters 24, 26, preferably digital, transmit radio frequency pulses or pulse packets to a whole-body RF birdcage coil 28 to generate the $B_1$ radio frequency fields within the examination region. A typical radio frequency pulse is composed of a packet of immediately contiguous pulse segments of short duration which, taken together with each other and any applied gradients, achieve the selected magnetic resonance manipulation. The RF pulses are used to saturate, excite resonance, invert magnetization, refocus resonance, or manipulate resonance in selected portions of the examination region. For whole-body applications, the resonance signals are commonly picked up in quadrature by the whole-body RF birdcage coil 28.

Local coils are commonly placed contiguous to selected regions of the subject for receiving induced magnetic resonance signals from the selected regions. In the embodiment of FIG. 1, a local radio frequency coil 30 includes a planar loop coil 32 and a Helmholtz pair 34. In this configuration, the radio frequency loop coil 32 is primarily sensitive magnetic field components along a first vertical axis, while the Helmholtz pair 34 is primarily sensitive to magnetic field components along a second horizontal axis, which is orthogonal to the first axis. It is to be appreciated that other specialized RF coils, such as a birdcage coil or butterfly and loop combination, may be utilized as well for receiving magnetic resonance signals having a 90° phase shifted relationship. The loop coil 32 and Helmholtz pair 34 are connected with a pair of amplifiers 36, 38. The amplified received resonance signals are conveyed to a combination circuit 40, which includes a combiner 42 and a switch assembly $44_1$, $44_2$ for operation in a quadrature mode or a phased array mode based on the desired application. The workings of the combination circuit and switch are described more fully below. Preferably, the amplifiers 36, 38 and the combination circuit are mounted on the coil 30. The resultant radio frequency signals are demodulated by corresponding receivers 46, 48.

A sequence control processor 50 controls the gradient pulse amplifiers 20 and the transmitters 24, 26 to generate any of a plurality of magnetic resonance imaging and spectroscopy sequences, such as echo-planar imaging, echo-volume imaging, gradient and spin echo imaging, fast spin echo imaging, and the like. For the selected sequence, the receivers 46, 48 receive a plurality of magnetic resonance signals in rapid succession following RF excitation pulses. Analog-to-digital converters 52, 54, which are preferably incorporated into the receivers 46, 48 convert each magnetic resonance signal to a digital format. The analog-to-digital converters 52, 54 are disposed between the radio frequency receiving coils and the receivers for digital receivers and are disposed downstream (as illustrated) from the receivers for analog receivers. Ultimately, the demodulated radio frequency signals received are reconstructed into an image representation by a reconstruction processor 60 which applies a two-dimensional Fourier transform or other appropriate reconstruction algorithm. The image may represent a planar slice through the patient, an array of parallel planar slices, a three-dimensional volume, or the like. The image is then stored in an image memory 62 where it is accessed by a display 64, such as a video monitor, active matrix monitor, or liquid crystal display, which provides a human-readable display of the resultant image.

Figure 2:
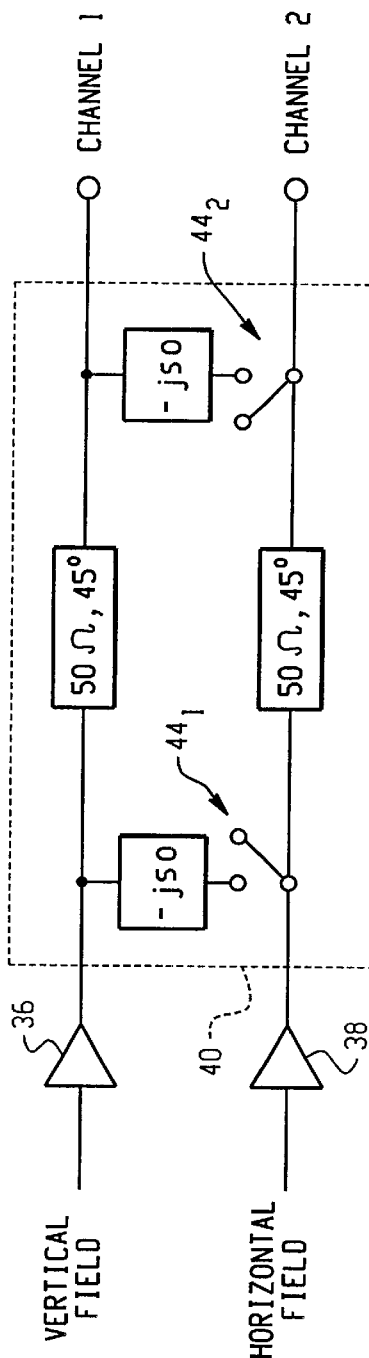
FIG. 2 is a schematic illustration of a switchable combination circuit in accordance with the present invention.

With reference to FIG. 2 and continued reference to FIG. 1, the combination and switch circuit 40 receives amplified magnetic resonance signals from the RF coils 32, 34 which have a substantially 90° phase relationship. The combination and switch circuit includes a switch assembly 44, 442 for switching between a quadrature mode or a phased array mode. With the switches in a closed or short circuit position, the combination circuit operates in quadrature mode. The two signals are phase shifted 90° relative to each other and combined using a standard combiner 42. More specifically, the signals that are shifted into phase alignment and summed become the quadrature output at channel 1, while antiquadrature signals become the output at channel 2. With the switches in an open circuit position, the combination circuit operates in a phased array mode in which the two signals are delayed, but otherwise unaltered, and passed separately to the receivers for further signal processing.

Figure 3:
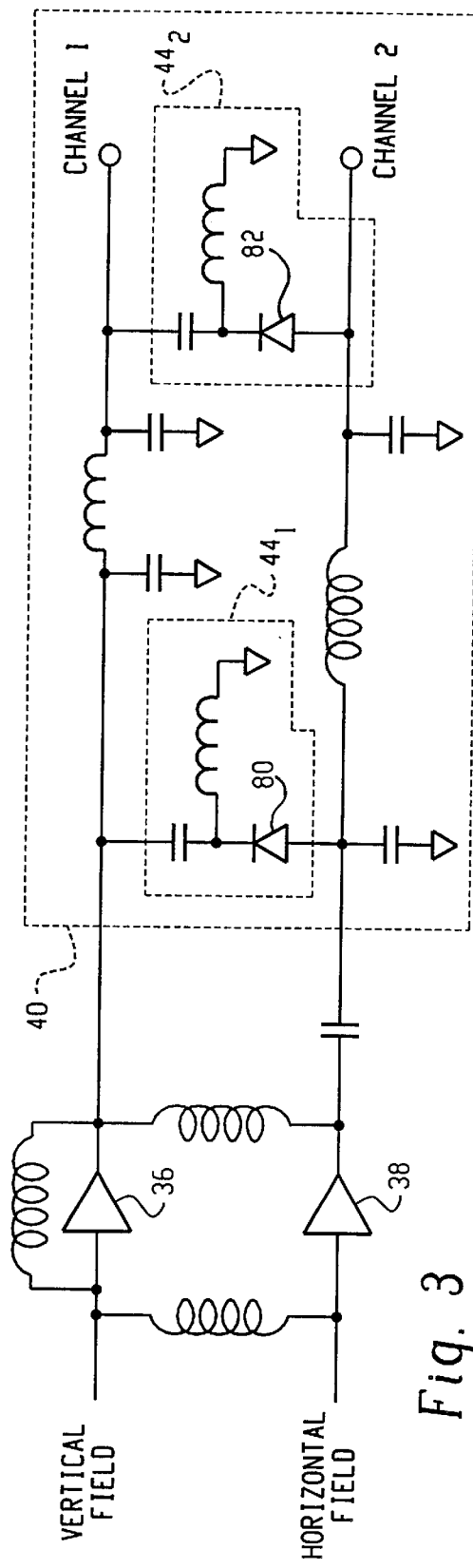
FIG. 3 is a schematic illustration of a multimode combination circuit in accordance with the present invention.

With reference to FIG. 3 and continued reference to FIG. 2, the switching function of the switch assembly $44_1$, $44_2$, which is incorporated into the combination and switch circuit 40, is preferably achieved using a pair of PIN diodes 80, 82, as shown. The switch assembly switches between the quadrature mode and the phased array mode based on the presence or absence of a DC biasing potential at channel 2. The presence of a DC biasing potential at channel 2 forward biases the PIN diodes such that the two phase shifted signals are combined. In contrast, without a DC bias at channel 2, the PIN diodes prevent current flow, acting as open circuits, such that the two phase shifted signals are passed separately to the receivers at channel 1 and channel 2, respectively. Those skilled in the art will appreciate that this switching capability allows an operator to switch modes, depending on desired application, within a single examination. For example, for applications which require greater reconstruction speed, the operator would select the quadrature combination mode. For applications which require better image quality, the operator would select phased array mode.

In the quadrature or combination mode, the combination circuit outputs to the receivers 46, 48 a quadrature combined signal on channel 1 and an anti-quadrature signal on channel 2. It is to be appreciated that the anti-quadrature signal is approximately one-half the magnitude of the quadrature signal. The quadrature and anti-quadrature signals are then passed to separate receivers where they are demodulated and reconstructed into two image representations, as described above. In another embodiment, the quadrature and anti-quadrature image representations are then added or averaged, improving the signal-to-noise ratio.

Figure 4:
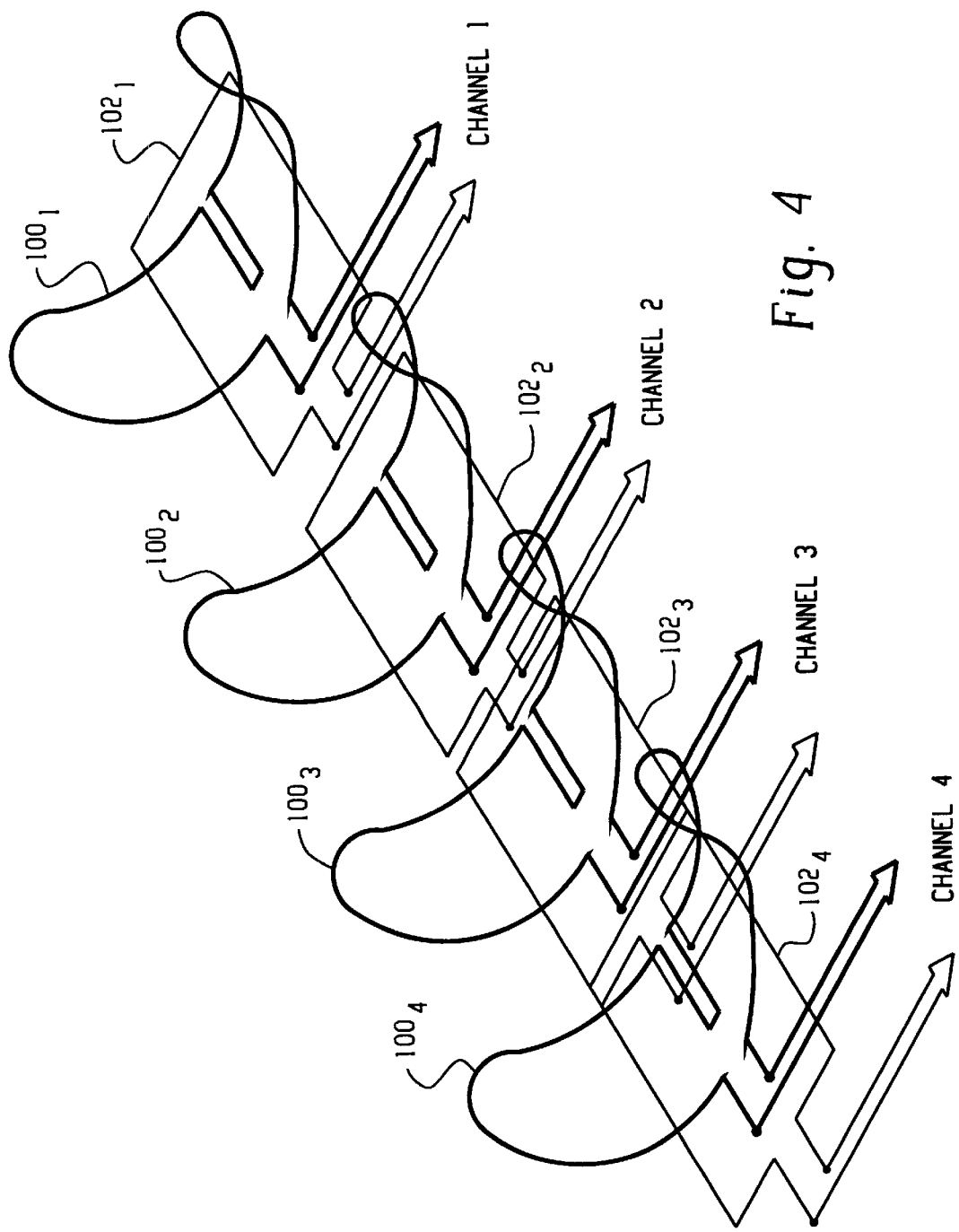
FIG. 4 is a preferred multi-mode receiver coil assembly in accordance with the present invention.

While the present invention has been described with reference to magnetic resonance systems having two RF coils and two channels, artisans will appreciate that the present invention is applicable to magnetic resonance systems having four or more RF coils and channels as well. For example, with reference to FIG. 4, a butterfly coil or Helmholtz coil 100₁ for one mode is curved to follow the contour of a patient's neck, while a flat loop coil 102₁ for another mode is arrayed for imaging the spine. An array of paired butterfly coils 100₂, 100₃, 100₄ and an array of flat loop or ladder coils 102₂, 102₃, 102₄ are arrayed and mounted in a flat structure or the patient couch for additional imaging applications, such as a spine application, in a multi-channel configuration. In a neck imaging application, at least one butterfly and one loop or ladder coil are combined in quadrature as a single channel, leaving the remaining coils and channels free for spine imaging applications. Alternately, the coils in the head piece can be conveyed to separate receiver channels.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus having a main magnet which generates a main magnetic field through an examination region, a radio frequency (RF) transmitter coil positioned about the examination region such that it excites magnetic resonance dipoles therein, an RF transmitter which drives the RF transmitter coil, a multi-mode RF receiver coil assembly which receives magnetic resonance signals from the resonating dipoles, said multi-mode RF receiver coil assembly being switchable between a quadrature combining mode and a phased array mode without a change in RF coil structure, and at least two receivers which receive and demodulate output signals from the multi-mode receiver coil assembly, the multi-mode receiver coil assembly comprising:

at least one first RF coil, said first RF coil being sensitive to a magnetic field along a first axis;

at least one second RF coil, said second RF coil being sensitive to magnetic field along a second axis which is orthogonal to the first axis;

a signal combining circuit operatively connected to the first and second RF coils, said signal combining circuit having (1) the quadrature combining mode in which it quadrature combines signals received by the first and second RF coils and (2) the phased array mode in which it passes signals received by the first and second RF coils to corresponding receivers without combining said signals; and a switch assembly connected to the signal combining circuit, said switch assembly switching the combining circuit between the quadrature combining mode and the phased array mode.

2. The magnetic resonance apparatus according to claim 1, wherein the signal combining circuit includes:

a phase shift circuit operatively connected to at least one of the first RF coil and the second RF coil for phase shifting received signals by 90° relative to one another.

3. A magnetic resonance apparatus having a means for generating a main magnetic field through an examination region, a means for exciting magnetic resonance dipoles in the examination region, a multi-mode RF coil assembly which receives magnetic resonance signals from the resonating dipoles, and at least two receivers which receive and demodulate output signals from the multi-mode RF coil assembly, the multi-mode RF coil assembly comprising:

at least one first RF coil assembly, said first RF coil assembly being sensitive to a magnetic field along a first axis;

at least one second RF coil assembly, said second RF coil assembly being sensitive to magnetic field along a second axis which is orthogonal to the first axis;

a signal combining means operatively connected to and disposed on the first and second RF coil assemblies, said signal combining means having (1) a quadrature combining mode in which it quadrature combines signals received by the first and second RF coil assemblies and (2) a phased array mode in which it passes signals received by the first and second RF coil assemblies to corresponding receivers without combining said signals; and a switch means connected to the signal combining means and disposed adjacent the combining circuit on the RF coil assemblies, which switch means switches the combining means between the quadrature combining mode and the phased array mode without modifying the first and second RF coil assemblies, said switch means including a pair of diodes which are responsive to a DC biasing potential.

4. The magnetic resonance apparatus according to claim 3, wherein the presence of the DC biasing potential switches the receiver assembly to the quadrature combining mode.

5. The magnetic resonance apparatus according to claim 3, wherein the absence of the DC biasing potential switches the receiver assembly to the phased array mode, in the phased array mode, the at least two receivers receive an output signal sensed by the first RF coil and an output signal sensed by the second RF coil.

6. A magnetic resonance apparatus having a main magnet which generates a main magnetic field through an examination region, a radio frequency (RF) transmitter coil positioned about the examination region such that it excites magnetic resonance dipoles therein, an RF transmitter which drives the RF transmitter coil, a multi-mode RF receiver coil assembly which receives magnetic resonance signals from the resonating dipoles, and at least two receivers which receive and demodulate output signals from the multi-mode receiver coil assembly, the multi-mode receiver coil assembly comprising:

at least one first RF coil, said first RF coil being sensitive to a magnetic field along a first axis;

at least one second RF coil, said second RF coil being sensitive to magnetic field along a second axis which is orthogonal to the first axis;

a signal combining circuit operatively connected to the first and second RF coils, said signal combining circuit having:

(1) a phase shift circuit operatively connected to at least one of the first and second RF coils for phase shifting received signals by 90° relative to one another;

(2) a quadrature combining mode in which it quadrature combines signals received by the first and second RF coils, in the quadrature combining mode, one of the at least two receivers receive a quadrature output signal and another of the receivers receives an anti-quadrature output signal from the signal combining circuit; and (3) a phased array mode in which it passes signals received by the first and second RF coils to corresponding receivers without combining said signals; and a switch assembly connected to the signal combining circuit, said switch assembly switching the combining circuit between the quadrature combining mode and the phased array mode.

7. The magnetic resonance apparatus according to claim 6, said apparatus further comprising:

a quadrature reconstruction processor which reconstructs the quadrature output signal into a quadrature image representation;

an anti-quadrature reconstruction processor which reconstructs the anti-quadrature output signal into an anti-quadrature image representation; and an adder which adds the quadrature image representation and the anti-quadrature image representation.

8. A multi-mode magnetic resonance method including:

generating a main magnetic field through an examination region;

transmitting RF signals into the examination region to induce magnetic resonance in nuclei;

receiving the induced magnetic resonance signals using a first pair of RF quadrature coils and a second pair of RF quadrature coils, said first and second pairs of RF coils being disposed in a linear array;

switching between one of a quadrature combination mode and a phased array mode;

in the quadrature combination mode, (i) phase shifting the received signals and (ii) combining the received, phase shifted signals into a quadrature signal and an anti-quadrature signal;

in the phased array mode, passing the received magnetic resonance signals uncombined;

demodulating the received magnetic resonance signals; and reconstructing the demodulated signals into an image representation.

9. The method according to claim 8, wherein the selecting step includes:

optionally applying a DC bias to a switch assembly to select the quadrature combination mode.

10. The method according to claim 8, further including:

reconstructing the quadrature signal into a quadrature image representation;

reconstructing the anti-quadrature signal into an anti-quadrature image representation; and combining the quadrature anti-quadrature image representations.

11. A multi-mode RF assembly for use in a magnetic resonance apparatus, the multi-mode RF assembly comprising:

a first RF coil assembly including at least one RF coil, said first RF coil assembly being sensitive to a magnetic field along a first axis to generate a first resonance signal;

a second RF coil assembly including at least one RF coil, said second RF coil assembly being sensitive to a magnetic field along a second axis which is orthogonal to the first axis to generate a second resonance signal 90° out of phase from the first resonance signal;

a signal combining circuit which phase shifts and additively combines the phase shifted first and second is resonance signals into a quadrature output and subtractively combines the phase shifted resonance signals into an anti-quadrature output; and a switch assembly which switches between outputting one of (i) a combined quadrature signal and a combined anti-quadrature signal and (ii) the uncombined first and second resonance signals.

12. A method of quadrature operation in a magnetic resonance apparatus, the method including:

(a) generating a temporally constant magnetic field through an examination region;

(b) transmitting RF signals into the examination region to induce magnetic resonance in nuclei;

(c) detecting induced magnetic resonance signals in quadrature using a quadrature coil assembly;

(d) combining and phase shifting by 90° the detected signals into a quadrature signal and an anti-quadrature signal using a quadrature adder;

(e) transferring the quadrature and anti-quadrature signals to a pair of receivers; and (f) reconstructing the received quadrature and anti-quadrature signals into an image representation.

13. The method according to claim 12, wherein step (f) includes:

reconstructing the quadrature signal into a quadrature image representation;

reconstructing the anti-quadrature signal into an anti-quadrature image representation; and combining the quadrature image representation and the anti-quadrature image representation.

* * * * *